United States Patent
Sasaki et al.

(10) Patent No.: US 10,599,202 B2
(45) Date of Patent: Mar. 24, 2020

(54) ELECTRONICS DEVICE

(71) Applicant: ALPS ALPINE CO., LTD., Tokyo (JP)

(72) Inventors: Takashi Sasaki, Miyagi (JP);
Yukimitsu Yamada, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 183 days.

(21) Appl. No.: 15/938,053

(22) Filed: Mar. 28, 2018

(65) Prior Publication Data

US 2018/0217652 A1  Aug. 2, 2018

Related U.S. Application Data

(63) Continuation of application No. PCT/JP2016/077322, filed on Sep. 15, 2016.

(30) Foreign Application Priority Data

Oct. 13, 2015 (JP) .................. 2015-202486

(51) Int. Cl.
*G06F 1/26* (2006.01)
*G06F 1/30* (2006.01)
(Continued)

(52) U.S. Cl.
CPC .................. *G06F 1/30* (2013.01); *G06F 1/24* (2013.01); *G06F 1/26* (2013.01); *G06F 1/32* (2013.01);
(Continued)

(58) Field of Classification Search
CPC ... G06F 1/30; G06F 11/30; G06F 1/32; G06F 1/24; G06F 1/26; H03K 17/223; H03K 3/353
(Continued)

(56) References Cited

U.S. PATENT DOCUMENTS 8,892,859 B1  11/2014  Eny
2008/0284389 A1*  11/2008  Kawase .................... G06F 1/24
323/266
(Continued)

FOREIGN PATENT DOCUMENTS

JP  2002-278657  9/2002
JP  2007-090739  4/2007
(Continued)

OTHER PUBLICATIONS

International Search Report dated Nov. 22, 2016 in PCT/JP2016/077322 filed on Sep. 15, 2016.
Extended European Search Report for 16855225.5 dated Sep. 3, 2018.

*Primary Examiner* — Volvick Derose
(74) *Attorney, Agent, or Firm* — IPUSA, PLLC (57) ABSTRACT

An operation signal generating unit 11 and a reset unit 12 are included in a first circuit unit 10 that operates based on a first power supply voltage V1 and an output operation of a second power supply voltage B2 is stopped by outputting a reset signal Sr from the reset unit 12 to a regulator 20 in accordance with an operation signal Si of the operation signal generating unit 11. Hence, unlike a conventional technique, a large transistor for cutting off a power supply line is unnecessary, and therefore a device size can be reduced.

5 Claims, 5 Drawing Sheets

(51) Int. Cl.
  *G06F 1/24* (2006.01)
  *G06F 1/32* (2019.01)
  *G06F 11/30* (2006.01)
  *H03K 3/353* (2006.01)
  *H03K 17/22* (2006.01)
  *G06F 1/3203* (2019.01)

(52) U.S. Cl.
  CPC ............. *G06F 11/30* (2013.01); *H03K 3/353* (2013.01); *H03K 17/223* (2013.01); *G06F 1/3203* (2013.01)

(58) Field of Classification Search
  USPC .......................................................... 713/300
  See application file for complete search history.

(56) References Cited

U.S. PATENT DOCUMENTS

| | | | | |
|---|---|---|---|---|
| 2009/0167087 A1* | 7/2009 | Clemo | .................... | H02J 1/102 307/43 |
| 2012/0049829 A1* | 3/2012 | Murakami | .............. | H02M 1/32 323/288 |
| 2012/0212192 A1* | 8/2012 | Peto | ..................... | H02M 5/293 323/223 |
| 2015/0012117 A1 | 1/2015 | Sakamaki et al. | | |

FOREIGN PATENT DOCUMENTS

| | | |
|---|---|---|
| JP | 2013-029968 | 2/2013 |
| JP | 2013-078021 | 4/2013 |
| JP | 2015-014825 | 1/2015 |
| WO | 2013/015151 | 1/2013 |

* cited by examiner

ELECTRONICS DEVICE

CROSS-REFERENCE TO RELATED APPLICATIONS

The present application is a continuation application of International Application No. PCT/JP2016/077322 filed on Sep. 15, 2016, which claims priority to Japanese Patent Application No. 2015-202486 filed on Oct. 13, 2015. The contents of these applications are incorporated herein by reference in their entirety.

BACKGROUND OF THE INVENTION

1. Field of the Invention

The present invention relates to an electronic device that is able to reset an operation state.

2. Description of the Related Art

A computer may malfunction due to various factors such as electrostatic discharge (ESD), and may run out of control. If it is a minor malfunction, it is possible to reset the operation state by giving a predetermined reset signal to the computer, but if it is uncontrollable, it may be impossible to receive a reset signal. In a power cutoff device described in the following patent document, when it is detected that a microcomputer runs out of control, a path of supplying power to the microcomputer is forcibly cut off by a switch of a transistor. By cutting off the power supply, even if the microcomputer is in an uncontrollable state, it is possible to accurately reset the operation state of the microcomputer.

CITATION LIST

Patent Document

[Patent Document 1] Japanese Unexamined Patent Application Publication No. 2002-278657

SUMMARY OF THE INVENTION

Technical Problem

However, in the method described in Patent Document 1, because a power supply line through which a relatively large electric current flows is directly cut off by the switch of the transistor, it is required to add a large size transistor having a small on-resistance, and there is a problem that that the device size is large.

The present invention is made in view of the above, and has an object to provide an electronic device that can accurately reset the operation state while reducing the size of the device.

Solution to Problem

An electronic device according to the present invention includes: a regulator configured to output, based on an input first power supply voltage, a second power supply voltage and to be able to stop an output operation of the second power supply voltage in accordance with a reset signal; a first circuit unit configured to operate based on the first power supply voltage; a second circuit unit configured to operate based on the second power supply voltage; and a signal transmitting unit configured to transmit a signal from the first circuit unit to the second circuit unit. The first circuit unit includes an operation signal generating unit configured to generate an operation signal in accordance with a predetermined input operation and a reset unit configured to output the reset signal in accordance with the operation signal. The second circuit unit includes a processing unit configured to execute a process in accordance with a control signal. The signal transmitting unit transmits the operation signal as the control signal to the processing unit and blocks an electric current that flows from the first circuit unit to the second circuit unit.

According to the above described configuration, the operation signal generating unit and the reset unit are included in the first circuit unit, which operates based on the first power supply voltage. The output operation of the second power supply voltage is stopped by outputting the reset signal from the reset unit to the regulator in accordance with the operation signal of the operation signal generating unit. Therefore, a transistor for cutting off a power supply line is unnecessary.

Further, the operation-signal of the operation signal generating unit is transmitted as the control signal to the processing unit of the second circuit unit via the single transmitting unit, and a process in accordance with the control signal is executed in the processing unit. Accordingly, it is not required to provide a dedicated circuit, an input switch, or the like for generating the control single to be input to the processing unit.

Furthermore, when the output operation of the second power supply voltage of the regulator has been stopped in accordance with the reset signal of the reset unit, while the first power supply voltage continues being supplied to the first circuit unit, the second power supply voltage is stopped being supplied to the second circuit unit. In this case, the electric current that flows from the first circuit unit to the second circuit unit is blocked by the signal transmitting unit. Therefore, it is possible to prevent power consumption from being increased due to the electric current and to prevent the second circuit unit from being degraded.

Preferably, in accordance with the operation signal, the signal transmitting unit may conduct or cut off an electric current of the control signal that flows from an input node of the control signal of the processing unit to ground.

For example, the signal transmitting unit may include a first diode that is provided on a path between an output node of the operation signal of the operation signal generating unit and the input node of the control signal of the processing unit and that blocks an electric current that flows from the output node of the operation signal to the input node of the control signal.

Also, for example, the signal transmitting unit may include a transistor that is provided on a path between the input node of the control signal of the processing unit and the ground and that is conducted or cut off in accordance with the operation signal.

Preferably, the operation signal generating unit may set a level of the operation signal to be a first level or a second level in accordance with the predetermined operation. When the level of the operation signal is one of the first level and the second level, the signal transmitting unit may conduct the electric current of the control signal, and when the level of the operation signal is the other of the first level and the second level, the signal transmitting unit may cut off the electric current of the control signal. The processing unit may determine, based on conduction and cutoff of the electric current of the control signal, whether a keeping time period of the first level of the operation signal is included in a predetermined time range, and may execute a predetermined process when the keeping time period is included in the predetermined time range. The reset unit may output the reset signal to stop the output operation of the second power supply voltage when the keeping time period has reached a predetermined time period that is longer than a longest time period in the predetermined time range.

According to the above described configuration, when the predetermined input operation has been performed to keep the first level of the operation signal for a time period within the predetermined time range, the predetermined process is executed in the processing unit. On the other hand, when the predetermined input operation has been performed to keep the first level of the operation signal for the predetermined time period, which is longer than the longest time period within the predetermined time range, or more, the reset signal is output from the reset unit to the regulator and the output operation of the second power supply voltage is stopped. Therefore, in accordance with the keeping time period of the signal level of the operation signal, execution of the predetermined process at the processing unit and stop of the output operation of the second power supply voltage at the regulator are selected.

Preferably, the second circuit unit may include an analog signal generating unit configured to generate an analog signal; and a level limiting unit configured to limit, when a level of the analog signal has exceeded the second power supply voltage, an excess part voltage to within a predetermined voltage range. The processing unit may apply a predetermined signal process to the analog signal.

According to the above described configuration, when the level of the analog signal has exceeded the second power supply voltage by stopping the output operation of the second power supply voltage in the regulator, the excess part of the voltage of the analog signal with respect to the second power supply voltage is limited to within the predetermined voltage range. Thereby, the analog signal does not become at an excessive voltage with respect to the processing unit to which the power supply voltage is stopped being supplied.

Preferably, the level limiting unit may include a second diode that is provided on a path between an output node of the analog signal in the analog signal generating unit and a power supply line of the second power supply voltage, and that causes a forward current to flow from the output node of the analog signal to the power supply line upon the excess part voltage of the analog signal reaching a predetermined voltage.

Preferably, the above described electronic device may include a plurality of regulators each of which outputs the second power supply voltage; and a plurality of second circuit units that operate based on the second power supply voltage output from each of the regulators differing from each other. The processing unit and the analog signal generating unit may belong to the second circuit units differing from each other.

According to the above described configuration, because the second power supply voltage is independently supplied from the different regulators to the processing unit and the analog signal generating unit, noise of a digital signal generated in the processing unit is less likely to be transmitted to the analog signal generating unit.

Advantageous Effects of Invention

According to the present invention, it is possible to reset the operation state while reducing the size of the device.

DETAILED DESCRIPTION OF THE PREFERRED EMBODIMENTS

In the following, electronic devices according to embodiments of the present invention will be described with reference to the diagrams.

First Embodiment

Figure 1:
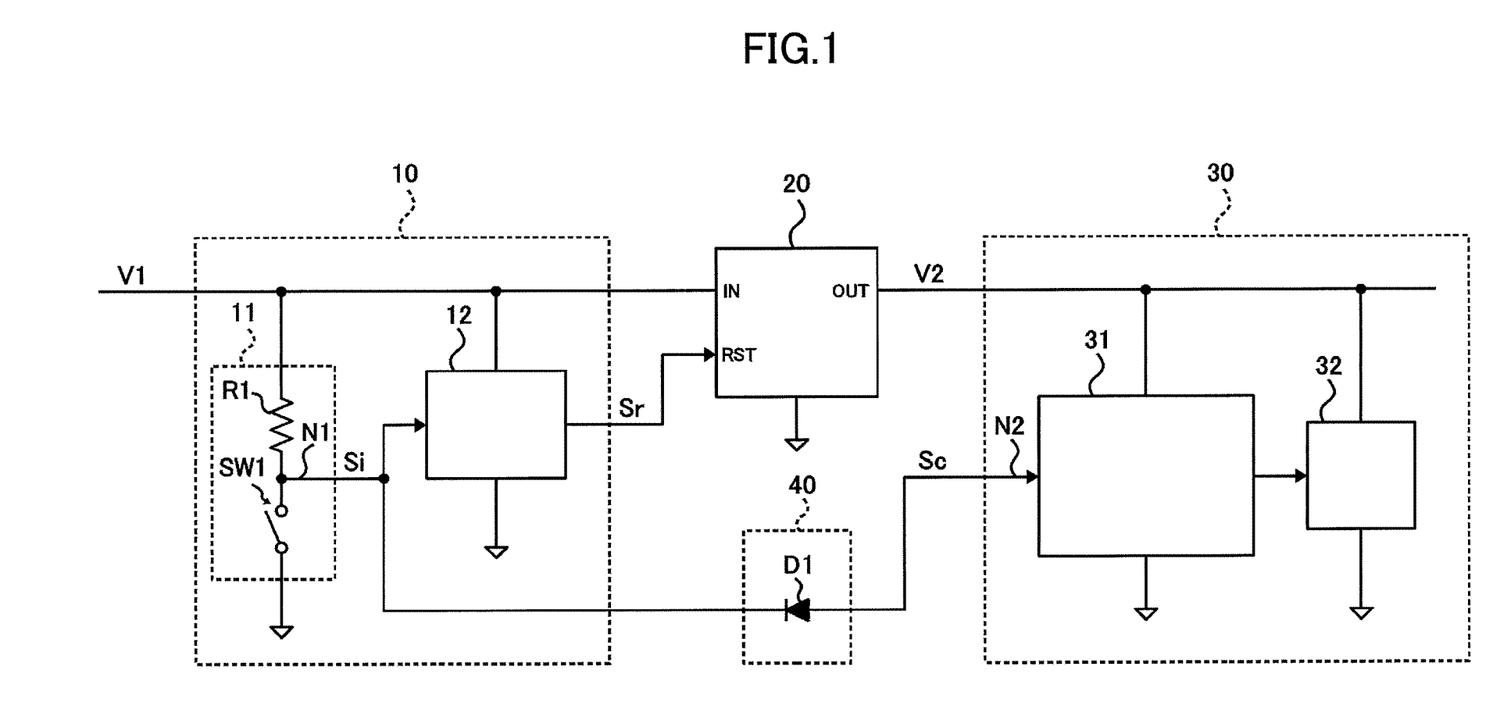
FIG. 1 is a diagram illustrating an example of a configuration of an electronic device according to a first embodiment of the present invention.

FIG. 1 is a diagram illustrating an example of a configuration of an electronic device according to a first embodiment. The electronic device illustrated in FIG. 1 includes a first circuit unit 10, a regulator 20, a second circuit unit 30, and a signal transmitting unit 40.

For example, the electronic device according to the present embodiment is a relatively small electronic device such as a wearable device or a portable terminal apparatus and includes a function to reset an operation state in accordance with an input operation of a user. As the device size becomes smaller, the area of a ground pattern of an electronic circuit becomes smaller and the ground potential easily fluctuates. Therefore, a reset function is required for when abnormality of an operation state occurs.

The regulator 20 outputs a second power supply voltage V2 based on a first power supply voltage V1 supplied from a battery (not illustrated) built in the electronic device or an external power supply apparatus. The circuit system of the regulator 20 may be a dropper type or a switching type. For example, the regulator 20 controls the second power supply voltage V2 so as to be equal to a predetermined target voltage that is lower than the first power supply voltage V1.

The regulator 20 stops the output operation of the second power supply voltage V2 in accordance with a reset signal Sr of a reset unit 12 that will be described later below. For example, in a case of being a dropper type, the regulator 20 puts a main transistor, which causes a voltage drop, into a cutoff state. In a case of being a switching type, the regulator 20 stops an on/off operation of a switching element to stop transmitting electric power from the input to the output.

The first circuit unit 10 is a circuit that operates based on the first power supply voltage V1 supplied from a battery or the like (not illustrated). In the example of FIG. 1, the first circuit unit 10 includes an operation signal generating unit 11 and the reset unit 12.

The operation signal generating unit 11 generates an operation signal Si in accordance with a predetermined input operation by user. For example, the operation signal generating unit 11 includes a resistor R1 and a switch SW1 provided in series on a path between the first power supply voltage V1 and the ground. The resistor R1 is provided on a path between an output node N1 of the operation signal Si and a power supply line of the first power supply voltage V1. The switch SW1 is provided on a path between the output node N1 and the ground.

The reset unit 12 outputs, to the regulator 20, a reset signal Sr in accordance with the operation signal Si. For example, when the low level of the operation signal Si (the state of turning on the switch SW1) continues for a predetermined time period or longer, that is, when the switch SW1 is kept in the on-state for a relatively long time period, the reset unit 12 outputs the reset signal Sr to stop the output operation of the second power supply voltage V2.

The second circuit unit 30 is a circuit that operates based on the second power supply voltage V2 supplied from the regulator 20. In the example of FIG. 1, the second circuit unit 30 includes a processing unit 31 and a communication unit 32.

The processing unit 31 is a circuit that executes a predetermined process in accordance with an input control signal Sc, and is configured to include, for example, a computer that executes a process based on an instruction code of a program stored in a memory and a dedicated logic circuit configured to execute a specific process.

The communication unit 32 is a circuit that performs communication with an external device under the control of the processing unit 31, and includes a communication function such as Bluetooth (registered trademark), for example.

The signal transmitting unit 40 is a circuit that transmits a signal from the first circuit unit 10 to the second circuit unit 30. Specifically, the signal transmitting unit 40 transmits, to the processing unit 31, the operation signal Si of the operation signal generating unit 11 as the control signal Sc. Further, the signal transmitting unit 40 is configured to block an electric current that flows from the first circuit unit 10 to the second circuit unit 30, and includes a diode D1 in the example of FIG. 1. The diode D1 is provided on an electric current path between the output node N1 of the operation signal Si in the operation signal generating unit 11 and the input node N2 of the control signal Sc in the processing part 31, and blocks the electric current that flows from the output node N1 to the input node N2.

Figure 2:
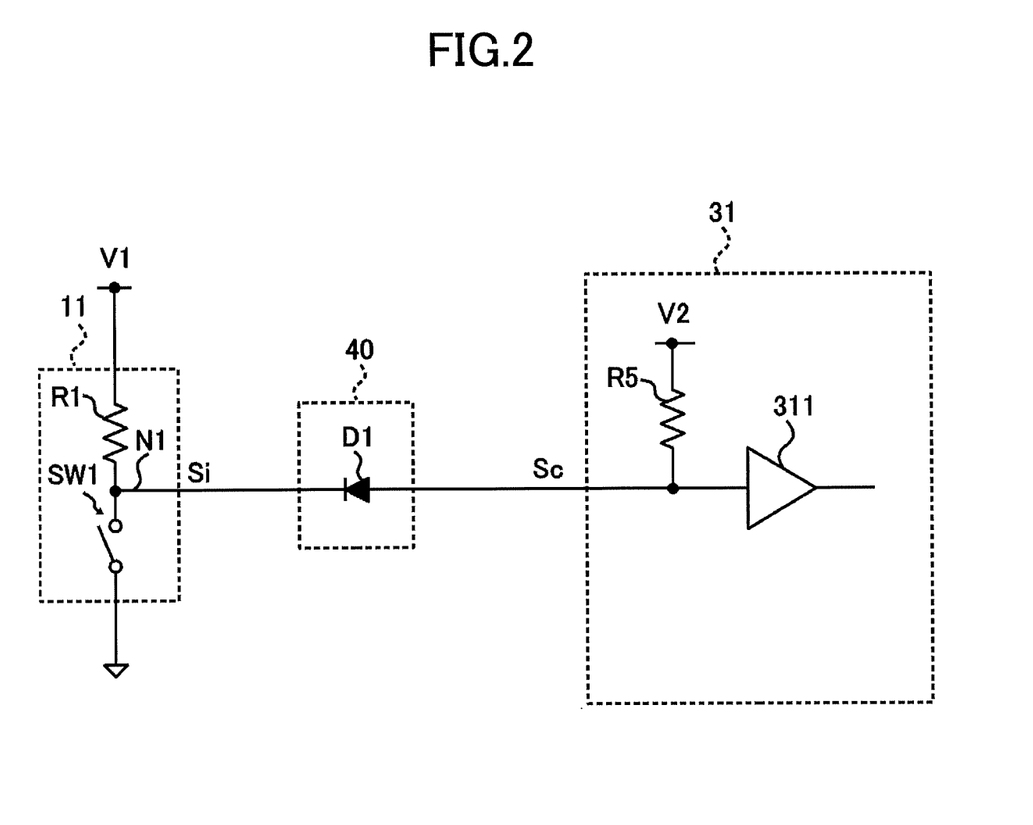
FIG. 2 is a diagram illustrating an example of a circuit that inputs a control signal to a processing unit in the electronic device, which is illustrated in FIG. 1.

FIG. 2 is a diagram illustrating an example of a circuit that inputs the control signal Sc to the processing unit 31 in the electronic device, which is illustrated in FIG. 1. As illustrated in FIG. 2, for example, the processing unit 31 includes a resistor R5 provided on a path between the input node N2 and the power supply line of the second power supply voltage V2, and an input buffer 311. The resistor R5 pulls up the voltage of the input node N2 to the second power supply voltage V2. The input buffer 311 outputs a signal in accordance with the voltage level of the input node N2 to an internal circuit (not illustrated).

Here, an operation of the electronic device according to the present embodiment having the above described configuration will be described.

The level of the operation signal Si becomes the high level or the low level in accordance with an operation of the switch SW1. That is, when the switch SW1 is off, because the output node N1 is connected to the power supply line of the first power supply voltage V1 via the resistor R1, the operation signal Si is at the high level. When the switch SW1 is on, because the output node N1 is connected to the ground by the switch SW1, the operation signal Si is at the low level.

When the operation signal Si is at the high level, while the first power supply voltage V1 is applied to the cathode of the diode D1 via the resistor R1, the second power supply voltage V2 is applied to the anode of the diode D1 via the resistor R5. In this case, because the first power supply voltage V1 is higher than the second power supply voltage V2, the diode D1 is in the off-state. Upon the diode D1 being turned off, an electric current that flows from the input node N2 to the ground (hereinafter referred to as "the electric current of the control signal Sc") is cut off by the diode D1. The voltage of the input node N2 (hereinafter referred to as "the voltage of the control signal Sc") is at a level (high level) substantially equal to that of the second power supply voltage V2.

On the other hand, when the operation signal Si is at the low level, the output node N1 is connected to the ground, thereby the anode of the diode D1 gets a higher potential than that of the cathode, and the diode D1 enters the on-state. Upon the diode D1 being turned on, the electric current of the control signal Sc flows from the input node N2 to the output node N1. The voltage of the control signal Sc at the input node N2 becomes a level (low level) substantially equal to the forward voltage of the diode D1.

In this way, in accordance with the level of the operation signal Si, the diode D1 of the signal transmitting unit 40 conducts or cuts off the electric current of the control signal Sc that flows from the input node N2 to the ground.

When being supplied with the second power supply voltage V2 and operating normally, the processing unit 31 executes a predetermined process based on the conduction and cutoff of the electric current of the control signal Sc in the signal transmitting unit 40 (based on whether the voltage of the control signal Sc is at the high level or at the low level). That is, based on the conduction and cutoff of the electric current of the control signal Sc, the processing unit 31 determines whether a keeping time period of the low level of the operation signal Si (a keeping time period of the on-state of the switch SW1) is included in a predetermined time range (T1 to T2). When the keeping time period is included in the predetermined time range (T1 to T2), the processing unit 31 executes the predetermined process. For example, the processing unit 31 controls the communication unit 32 to perform a pairing operation in Bluetooth (registered trademark) communication.

On the other hand, the reset unit 12 also monitors the keeping time period of the low level of the operation signal Si (the keeping time period of the on-state of the switch SW1), and when this keeping time period has reached a predetermined time period T3, the reset unit 12 outputs the reset signal Sr to stop the output operation of the second power supply voltage V2 in the regulator 20. This predetermined time period T3 is longer than the longest time period T2 in the predetermined time range (T1 to T2) as a criterion for determining whether to execute the predetermined process in the processing unit 31 (T3>T2). Therefore, when the keeping time period of the on-state of the switch SW1 is relatively short, the predetermined process (such as a pairing operation) is executed in the processing unit 31. When the keeping time period is relatively long, the output operation of the second power supply voltage V2 in the regulator 20 is stopped, and the operation state of the processing unit 31 is forcibly reset.

When the output operation of the second power supply voltage V2 has been stopped in the regulator 20, while the voltage of the input node N2 of the processing unit 31 becomes always zero, the voltage of the output node N1 of the operation signal generating unit 11 becomes substantially equal to the first power supply voltage V1 by turning off the switch SW1. However, upon the output node N1 getting a higher potential than that of the input node N2, the diode D1 of the signal transfer unit 40 enters the off-state, and therefore an electric-current does not flow from the output node N1 to the input node N2.

As described above, according to the electronic device according to the present embodiment, the first circuit unit 10 that operates based on the first power supply voltage V1 includes the operation signal generating unit 11 and the reset unit 12, and the reset signal Sr in accordance with the operation signal Si of the operation signal generating unit 11 is output from the reset unit 12 to the regulator 20 to stop the output operation of the second power supply voltage V2. Hence, unlike a conventional technique, a large transistor for cutting off a power supply line is unnecessary, and therefore a device size can be reduced.

Further, according to the electronic device according to the present embodiment, the operation signal Si generated in the operation signal generation unit 11 is input to the reset unit 12 and is also transmitted, as the control signal Sc, to the processing unit 31 of the second circuit unit 30 via the signal transmitting unit 40, and the predetermined process in accordance with the control signal Sc is executed in the processing unit 31. Therefore, the operation signal Si to be input to the reset unit 12 and the control signal Sc to be input to the processing unit 31 can be generated using the common operation signal generating unit 11. Therefore, the device size can be reduced in comparison with a case where dedicated circuits, input switches, and the like are respectively provided.

Furthermore, according to the electronic device according to the present embodiment, when the output operation of the second power supply voltage V2 of the regulator 20 has been stopped in accordance with the reset signal Sr of the reset unit 12, while the first power supply voltage V1 continues being supplied to the first circuit unit 10, the second power supply voltage V2 is stopped being supplied to the second circuit unit 30. However, in this case, because an electric current that flows from the first circuit unit 10 to the second circuit unit 30 is blocked by the signal transmission unit 40, it is possible to prevent an increase in power consumption due to the electric current and to prevent performance of the circuit of the processing unit 31 from being degraded.

Second Embodiment

Figure 3:
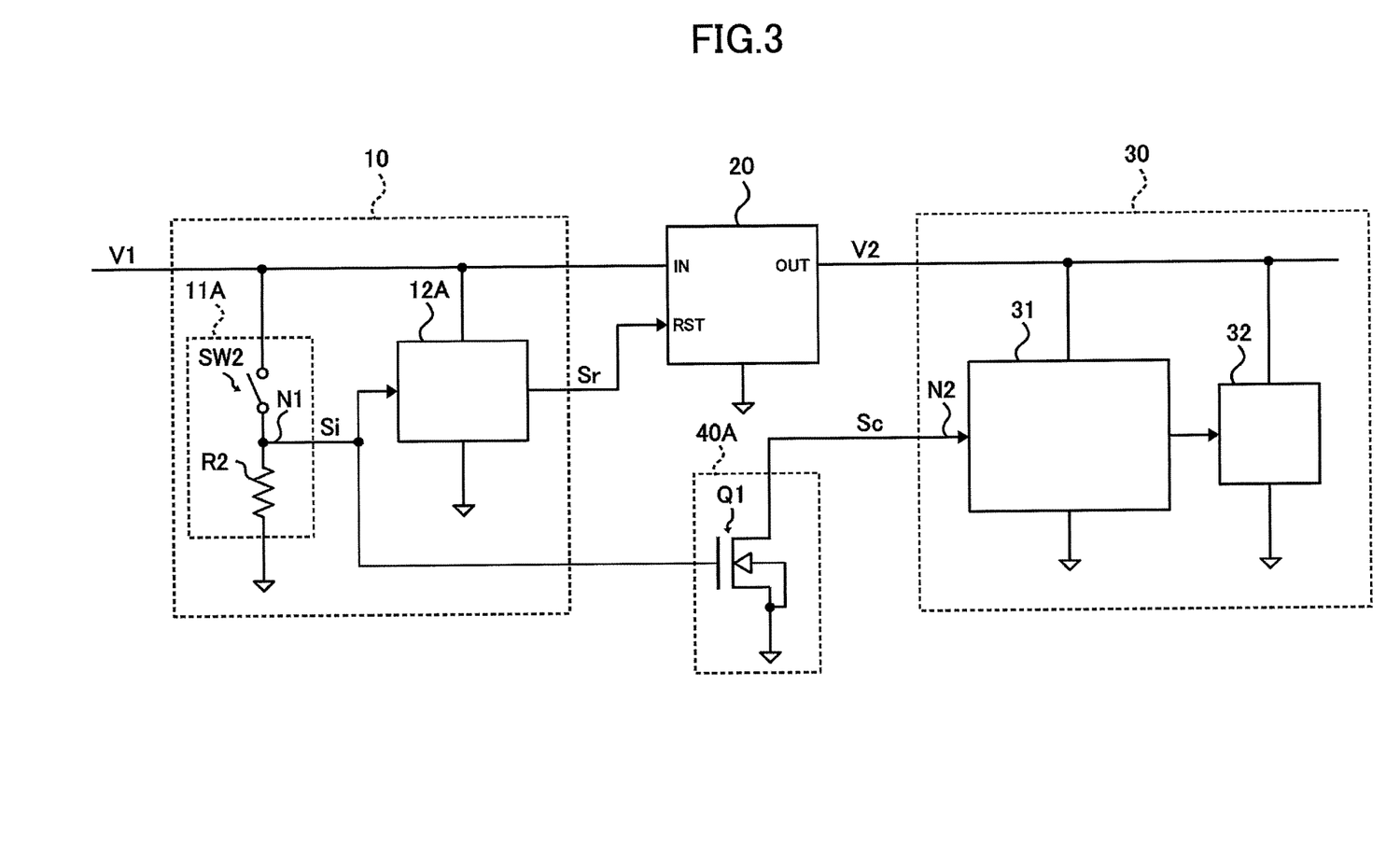
FIG. 3 is a diagram illustrating an example of a configuration of an electronic device according to a second embodiment of the present invention.
Figure 4:
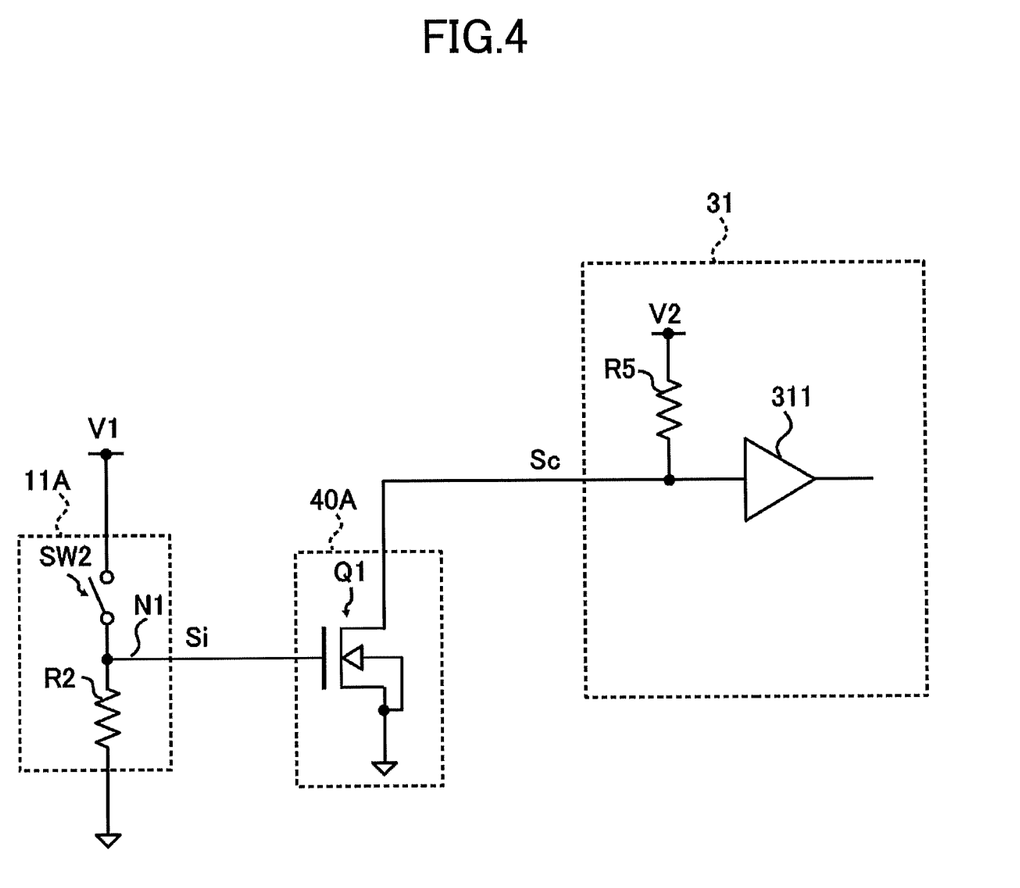
FIG. 4 is a diagram illustrating an example of a circuit that inputs a control signal to a processing unit in the electronic device, which is illustrated in FIG. 2.

Next, a second embodiment of the present invention will be described with reference to FIG. 3 and FIG. 4. FIG. 3 is a diagram illustrating an example of a configuration of an electronic device according to the second embodiment. FIG. 4 is a diagram illustrating an example of a circuit that inputs a control signal Sc to the processing unit 31 in the electronic device, which is illustrated in FIG. 3. The electronic device, which is illustrated in FIG. 3 and FIG. 4, is obtained by respectively replacing the operation signal generating unit 11 and the reset unit 12 of the first circuit unit 10 of the electronic device, which is illustrated in FIG. 1, with an operation signal generating unit 11A and a reset unit 12A and replacing the signal transmitting unit 40 with a signal transmitting unit 40A. Other components of the electronic device that is illustrated in FIG. 3 are the same as those of the electronic device that is illustrated in FIG. 1.

As illustrated in FIG. 3, the operation signal generating unit 11A includes a switch SW2 and a resistor R2 provided in series on a path between the first power supply voltage V1 and the ground. The switch SW2 is provided on a path between the output node N1 and a power supply line of the first power supply voltage V1. The resistor R2 is provided on a path between the output node N1 and the ground.

For example, when the low level of the operation signal Si (the state of turning on the switch SW2) continues for a predetermined time period or longer, that is, when the switch SW2 is kept in the on-state for a relatively long time period, the reset unit 12A outputs the reset signal Sr to stop the output operation of the second power supply voltage V2.

As illustrated in FIG. 3, the signal transmitting unit 40A includes a transistor Q1.

Although the transistor Q1 is an NPN MOSFET in the example of FIG. 3, but may be another type of transistor (such as a bipolar transistor, for example) in other embodiments of the present invention.

The transistor Q1 is provided on a path between the input node N2 of the control signal Sc of the processing unit 31 and the ground, and is conducted or cut off in accordance with the operation signal Si. The drain of the transistor Q1 is connected to the input node N2, the source of the transistor Q1 is connected to the ground, and the operation signal Si is input to the gate of the transistor Q1.

Here, an operation of the electronic device according to the present embodiment having the above described configuration will be described.

When the switch SW2 is off, because the output node N1 is connected to the ground via the resistor R2, the operation signal Si is at the low level. When the switch SW2 is on, because the output node N1 is connected to the power supply line of the second power supply voltage V2 by the switch SW2, the operation signal Si is at the high level.

When the operation signal Si is at the low level, because the voltage of the gate of the transistor Q1 is substantially zero, the transistor is in the off-state. Upon the transistor Q1 being turned off, an electric current of the control signal Sc that flows from the input node N2 to the ground is cut off by the transistor Q1. The voltage of the control signal Sc at the input node N2 is at a level (high level) substantially equal to that of the second power supply voltage V2.

On the other hand, when the operation signal Si is at the high level, the output node N1 is connected to the power supply line of the first power supply voltage V1, thereby the first power supply voltage V1 is applied to the gate of the transistor Q1, and the transistor Q1 enters the on-state. Upon the transistor Q1 being turned on, the electric current of the control signal Sc flows from the input node N2 to the output node N1. Assuming that the on-resistance of the transistor Q1 is sufficiently small, the voltage of the control signal Sc at the input node N2 becomes substantially zero.

In this way, in accordance with the level of the operation signal Si, the transistor Q1 of the signal transmitting unit 40 conducts or cuts off the electric current of the control signal Sc that flows from the input node N2 to the ground.

An operation of the processing unit 31 in accordance with the control signal Sc is the same as that of the above described electronic device, which is illustrated in FIG. 1. The processing unit 31 determines, based on the conduction and cutoff of the electric current of the control signal Sc (based on whether the voltage of the control signal Sc is at the high level or at the low level), whether a keeping time period of the high level of the operation signal Si is included in a predetermined time range (T1 to T2). When the keeping time period is included in the predetermined time range (T1 to T2), the processing unit 31 executes a predetermined process such as a pairing operation.

The reset unit 12A also monitors the keeping time period of the high level of the operation signal Si (the keeping time period of the on-state of the switch SW2), and when this keeping time period has reached a predetermined time period T3, the reset unit 12A outputs the reset signal Sr to stop the output operation of the second power supply voltage V2 in the regulator 20. This predetermined time period T3 is longer than the longest time period T2 in the predetermined time range (T1 to T2) as a criterion for determining whether to execute the predetermined process in the processing unit 31 (T3>T2). Therefore, when the keeping time period of the on-state of the switch SW2 is relatively short, the predetermined process (such as a pairing operation) is executed in the processing unit 31. When the keeping time period is relatively long, the output operation of the second power supply voltage V2 in the regulator 20 is stopped, and the operation state of the processing unit 31 is forcibly reset.

When the output operation of the second power supply voltage V2 has been stopped in the regulator 20, while the voltage of the input node N2 of the processing unit 31 becomes always zero, the voltage of the output node N1 of the operation signal generating unit 11 becomes substantially equal to the second power supply voltage V2 by turning off the switch SW2. However, because the voltage of the output node N1 is applied to the gate of the transistor Q1, an electric current does not flow from the output node N1 to the input node N2.

As described above, also by the electronic device according to the present embodiment, it is possible to achieve effects similar to those of the above described electronic device, which is illustrated in FIG. 1.

Further, according to the electronic device according to the present embodiment, the voltage of the input node N2 is substantially zero when the transistor Q1 is in the on-state. Therefore, the low level voltage of the control signal Sc at the input node N2 can be made lower than that of the electronic device, which is illustrated in FIG. 1. This makes it easier to reduce the second power supply voltage V2.

Third Embodiment

Figure 5:
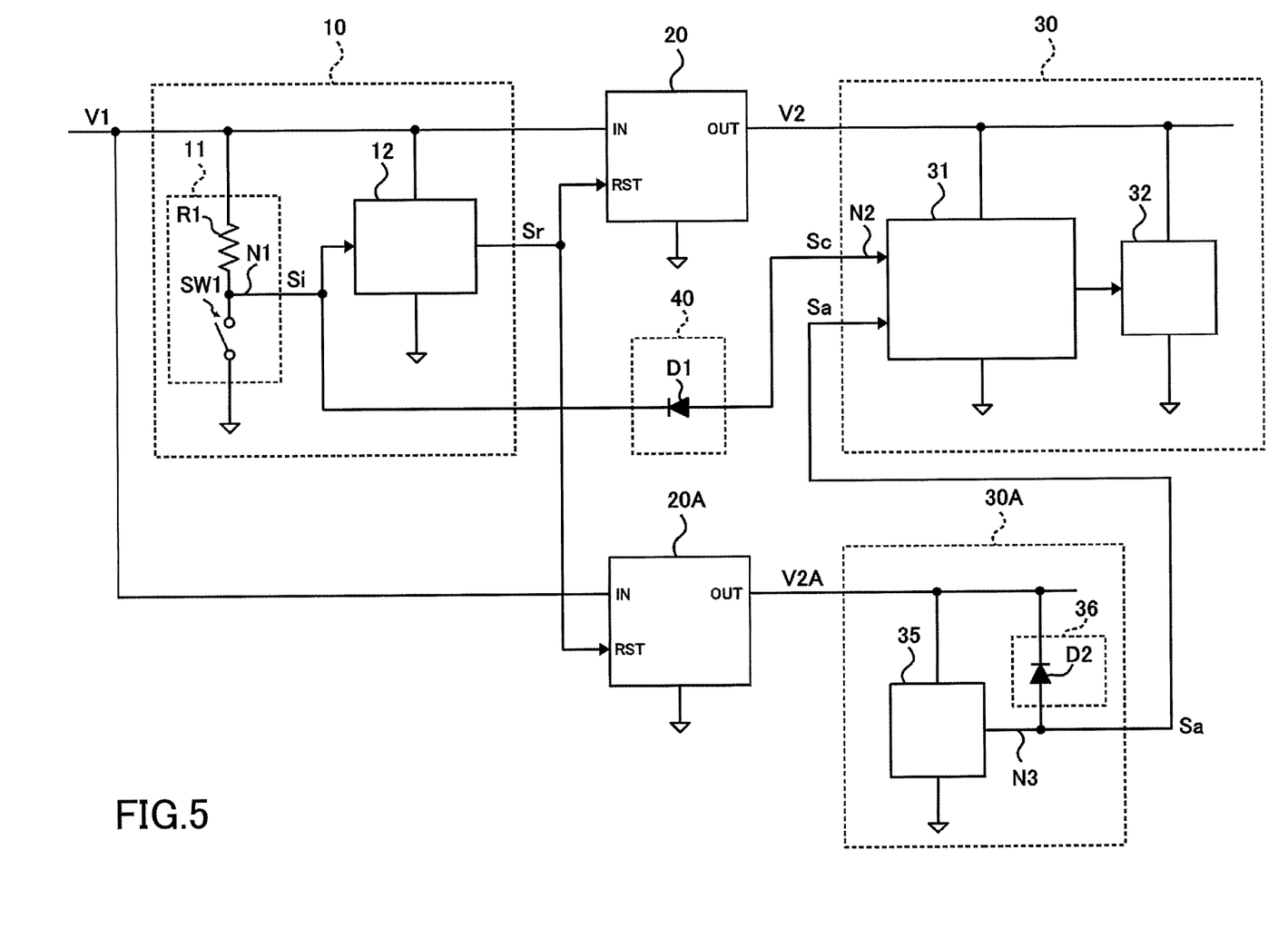
FIG. 5 is a diagram illustrating an example of a configuration of an electronic device according to a third embodiment of the present invention.

Next, a third embodiment of the present invention will be described. FIG. 5 is a diagram illustrating an example of a configuration of an electronic device according to the third embodiment. The electronic device, which is illustrated in FIG. 5, has a configuration similar to that of the electronic device, which is illustrated in FIG. 1, and includes a regulator 20A and a second circuit unit 30A.

The regulator 20A is a circuit that outputs a second power supply voltage V2A based on the first power supply voltage V1, and controls the second power supply voltage V2A so as to be substantially equal to the second power supply voltage V2 of the regulator 20, for example. Similar to the regulator 20, the regulator 20A stops the output operation of the second power supply voltage V2A in accordance with the reset signal Sr of the reset unit 12. Although the circuit system of the regulator 20A may be a dropper type or a switching type, in a case where a low noise circuit is required as the second circuit unit 30A that will be described later below, it is preferable that the circuit system of the regulator 20A is a low noise circuit system.

The second circuit unit 30A is a circuit that operates based on the second power supply voltage V2A supplied from the regulator 20A. In the example of FIG. 5, the second circuit unit 30A includes an analog signal generating unit 35 and a level limiting unit 36.

The analog signal generating unit 35 is a circuit that generates an analog signal Sa, such as an amplifier circuit that amplifies a signal of a sensor, for example. In the electronic device according to the present embodiment, the processing unit 31 inputs the analog signal Sa from the analog signal generating unit 35 to apply a predetermined signal process. For example, the processing unit 31 includes an analog-to-digital converter, and converts the analog signal Sa into a digital value signal. The processing unit 31 applies various signal processes to the converted digital value signal.

When the level of the analog signal Sa has exceeded the second power supply voltage V2A, the level limiting unit 36 limits the excess part voltage to within a predetermined voltage range. The level limiting unit 36 includes, for example, a diode D2, as illustrated in FIG. 5. The diode D2 is provided on a path between the output node N3 of the analog signal Sa in the analog signal generating unit 35 and the power supply line of the second power supply voltage V2A. The anode of the diode D2 is connected to the output node N3 side, and the cathode of the diode D2 is connected to the power supply line side. Upon the excess part of the voltage of the analog signal Sa with respect to the second power supply voltage V2A reaching a predetermined voltage, that is, upon the excess part of the voltage of the analog signal Sa reaching a forward voltage at which the diode D2 is turned on, the diode D2 causes a forward current to flow from the output node N3 of the analog signal Sa to the power supply line of the second power supply voltage V2.

For example, in a case where a circuit including a capacitor such as a low pass filter is connected to the output node N3 of the analog signal generating unit 35, even after the second power supply voltage V2A of the regulator 20A drops to zero, there is a possibility the voltage of the analog signal Sa is in a state of being higher than zero. Then, with respect to the analog signal generating unit 35 to which the second power supply voltage V2A is stopped being supplied or with respect to the processing unit 31 to which the second power supply voltage V2 is stopped being supplied, the analog signal Sa becomes at an excessive voltage, which is a factor for causing degradation of performance of these circuits. Hence, in the electronic device that is illustrated in FIG. 3, when the level of the analog signal Sa has exceeded the second power supply voltage V2A by stopping the output operation of the second power supply voltage V2A in the regulator 20A, the excess part of the voltage of the analog signal Sa with respect to the second power supply voltage V2A is limited to within the predetermined voltage range (to within a range equal to or lower than the forward voltage of the diode D2). Thereby, the analog signal Sa does not become at an excessive voltage with respect to the processing unit 31 or the analog signal generating unit 35 to which the power supply voltage (V2 or V2A) is stopped being supplied. Therefore, it is possible to effectively prevent performance of these circuits from being degraded.

Although various embodiments of the present invention have been described above, the present invention is not limited to the above described embodiments. That is, those skilled in the art may make various modifications, combinations, and substitutions for the configurations of the above described embodiments within the technical scope of the present invention or the equivalents thereof.

For example, although the electronic device that is illustrated in FIG. 5 has a configuration in which the regulator 20A and the second circuit unit 30A are added to the electronic device that is illustrated in FIG. 1, an electronic device according to another embodiment of the present invention may have a configuration in which the regulator 20A and the second circuit unit 30A are added to the electronic device that is illustrated in FIG. 3.

Although the electronic device that is illustrated in FIG. 5 includes two regulators (20 and 20A) and two second circuit portions (30 and 30A), an electronic device according to another embodiment of the present invention may include three or more regulators and three or more second circuit units.

DESCRIPTION OF THE REFERENCE NUMERALS 10 first circuit unit
11, 11A operation signal generating unit
12 reset unit
20, 20A regulator
30, 30A second circuit unit
31 processing unit
32 communication unit
35 analog signal generating unit
36 level limiting unit
40, 40A signal transmitting unit
D1 first diode
D2 second diode
Q1 transistor
SW1, SW2, switch
R1, R2 resistor
Si operation signal
Sr reset signal
Sc control signal
Sa analog signal
V1 first power supply voltage
V2, V2A second power supply voltage
N1, N3 output node
N2 input node

What is claimed is:

1. An electronic device comprising:
   a regulator configured to output, based on an input first power supply voltage, a second power supply voltage and to be able to stop an output operation of the second power supply voltage in accordance with a reset signal;
   a first circuit unit configured to operate based on the first power supply voltage;
   a second circuit unit configured to operate based on the second power supply voltage; and
   a signal transmitting unit configured to transmit a signal from the first circuit unit to the second circuit unit,
   wherein the first circuit unit includes
      an operation signal generating unit configured to generate an operation signal in accordance with a predetermined input operation, and
      a reset unit configured to output the reset signal in accordance with the operation signal,
   wherein the second circuit unit includes
      a hardware processor configured to execute a process in accordance with a control signal, and
   wherein the signal transmitting unit transmits the operation signal as the control signal to the hardware processor and blocks an electric current that flows from the first circuit unit to the second circuit unit,
   wherein, in accordance with the operation signal, the signal transmitting unit conducts or cuts off an electric current of the control signal that flows from an input node of the control signal of the hardware processor to ground, and
   wherein the signal transmitting unit includes a first diode that is provided on a path between an output node of the operation signal of the operation signal generating unit and the input node of the control signal of the hardware processor and that blocks an electric current that flows from the output node of the operation signal to the input node of the control signal.

2. The electronic device according to claim 1,
   wherein the operation signal generating unit sets a level of the operation signal to be a first level or a second level in accordance with the predetermined operation,
   wherein when the level of the operation signal is one of the first level and the second level, the signal transmitting unit conducts the electric current of the control signal, and when the level of the operation signal is the other of the first level and the second level, the signal transmitting unit cuts off the electric current of the control signal,
   wherein the hardware processor determines, based on conduction and cutoff of the electric current of the control signal, whether a keeping time period of the first level of the operation signal is included in a predetermined time range, and executes a predetermined process when the keeping time period is included in the predetermined time range, and
   wherein the reset unit outputs the reset signal to stop the output operation of the second power supply voltage when the keeping time period has reached a predetermined time period that is longer than a longest time period in the predetermined time range.

3. The electronic device according to claim 1, wherein the second circuit unit includes
   an analog signal generating unit configured to generate an analog signal; and
   a level limiting unit configured to limit, when a level of the analog signal has exceeded the second power supply voltage, an excess part voltage to within a predetermined voltage range, and
   wherein the hardware processor applies a predetermined signal process to the analog signal.

4. The electronic device according to claim 3, wherein the level limiting unit includes a second diode that is provided on a path between an output node of the analog signal in the analog signal generating unit and a power supply line of the second power supply voltage, and that causes a forward electric current to flow from the output node of the analog signal to the power supply line upon the excess part voltage of the analog signal reaching a predetermined voltage.

5. The electronic device according to claim 3, comprising:
   a plurality of regulators each of which outputs the second power supply voltage; and
   a plurality of second circuit units that operate based on the second power supply voltage output from each of the regulators differing from each other,
   wherein the hardware processor and the analog signal generating unit belong to the second circuit units differing from each other.

* * * * *